(12) United States Patent
Bhushan et al.

(10) Patent No.: US 8,248,094 B2
(45) Date of Patent: Aug. 21, 2012

(54) ACQUISITION OF SILICON-ON-INSULATOR SWITCHING HISTORY EFFECTS STATISTICS

(75) Inventors: Manjul Bhushan, Hopewell Junction, NY (US); Mark B. Ketchen, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 12/544,772

(22) Filed: Aug. 20, 2009

(65) Prior Publication Data

US 2011/0043242 A1 Feb. 24, 2011

(51) Int. Cl.
*G01R 31/02* (2006.01)
*G01R 31/26* (2006.01)

(52) U.S. Cl. ........... 324/762.01; 324/750.02; 324/76.35; 324/76.54; 324/617; 702/109; 714/724; 327/153; 331/57

(58) Field of Classification Search ..... 324/537–764.01; 702/109; 331/57; 714/699–815
See application file for complete search history.

(56) References Cited

U.S. PATENT DOCUMENTS

| | | | |
|---|---|---|---|
| 6,798,261 B1 * | 9/2004 | Bhushan et al. | 327/172 |
| 6,960,926 B2 * | 11/2005 | Anderson et al. | 324/537 |
| 7,205,825 B2 | 4/2007 | Klein et al. | |
| 7,355,902 B2 | 4/2008 | Bhushan et al. | |
| 7,504,896 B2 * | 3/2009 | Bhushan et al. | 331/57 |
| 2008/0068099 A1 * | 3/2008 | Bhushan et al. | 331/57 |
| 2009/0051396 A1 * | 2/2009 | Shimamoto | 327/153 |

OTHER PUBLICATIONS

M. Bhushan, et al; "CMOS Latch Metastability Characterization at the 65-nm-Technology Node;" Proc. 2008 IEEE International Conference on Microelectronic Test Structures; Mar. 2008.
M.R. Casu, et al.; "History Effect Characterization in PD-SOI CMOS Gates;" IEEE International SOI Conference; Oct. 2002; pp. 62-63.
F. Assaderaghi, et al.; "History Dependence of Non-Fully Depleted (NFD) Digital SOI Circuits;" Synmposium on VLSI Technology Digest of Technical Papers; 1996; pp. 122-123.
O. Faynot, et al.; "A new structure for in-depth history effect characterization on Partially Depleted SOI transistors;" IEEE International SOI Conference; Oct. 2002; pp. 35-36.
Jacques Gautier, et al.; "Body Charge Related Transient Effects in Floating Body SOI Nmosfet's;" IEDM Technical Digest, 623; 1995; pp. 26.1.1-26.1.4.

(Continued)

*Primary Examiner* — Roberto Velez
*Assistant Examiner* — Emily Chan
(74) *Attorney, Agent, or Firm* — Cantor Colburn LLP; Vazken Alexanian

(57) ABSTRACT

A test structure for gathering switching history effect statistics includes a waveform generator circuit that selectively generates a first test waveform representative of a 1SW transistor switching event, and a second test waveform representative of a 2SW transistor switching event; and a history element circuit coupled to the waveform generator circuit, the history element circuit including a device under test (DUT) therein, and a variable delay chain therein, wherein a selected one of the first and second test waveforms are input to the DUT and the variable delay chain; wherein the history element circuit determines fractional a change in signal propagation delay through the DUT between the 1SW and 2SW transistor switching events, with the fractional change in signal propagation delay calibrated with timing measurements of a variable frequency ring oscillator; and wherein the test structure utilizes only external low-speed input and output signals with respect to a chip.

20 Claims, 7 Drawing Sheets

OTHER PUBLICATIONS

J.S. Goo, et al.; "History-Effect-Conscious SPICE Model Extraction for PD-SOI Technology;" IEEE International SOI Conferences; Oct. 2004; pp. 156-158.

B. L. Ji, et al.; "On the Connection of SRAM Cell Stability with Switching History in Partially Depleted SOI Technology;" 8th International Conference on Solid-State and Integrated Circuit Technology (ICSICT), Shainghai, China; Oct. 23-26, 2006; pp. 788-791.

M. B. Ketchen et al.; "Circuit and technique for characterizing switching delay history effects in silicon-on-insulator logic gates;" Review of Scientific Instruments, vol. 75, No. 3, Mar. 2004; pp. 1-4.

M. B. Ketchen, et al.; "High Speed Test Structures for In-Line Process Monitoring and Model Calibration;" Proc. 2005 IEEE International Conferences on Microelectronics Test Structures; Apr. 2005; pp. 33-38.

Q. Liang, et al.; "Optimizing History Effects in 65nm PD-SOI CMOS;" IEEE International SOI Conferences Proceedings; 2006; pp. 95-96.

* cited by examiner

ACQUISITION OF SILICON-ON-INSULATOR SWITCHING HISTORY EFFECTS STATISTICS

BACKGROUND

The present invention relates generally to integrated circuit devices and, more particularly, to acquisition of silicon-on-insulator (SOI) switching history effect statistics.

History effects in partially depleted silicon-on-insulator (PD-SOI) technology are an important source of temporal variability. The delay of a circuit in PD-SOI depends on the circuit's previous switching activity. When a circuit initially switches after being at rest for a few milliseconds (ms) or more (1SW), it will have a different delay than when it switches again within a few nanoseconds (ns) of the initial event (2SW). The fractional difference of the 1SW and 2SW delays, referred to as the 1SW/2SW history, can be as much as 10% or more, and can be either positive with 2SW faster, or negative with 1SW faster. Steady state (SS) delay, as measured with a ring oscillator, typically lies somewhere between 1SW and 2SW. This behavior all derives from the floating body of PD-SOI, the potential of which directly modulates MOSFET threshold voltage (Vt) and is influenced by temperature, VDD, leakage currents, and capacitance.

History effect must be taken into account when gauging technology performance as measured, for example, with ring oscillators. It also impacts specific designs where the relative timing of different paths within a circuit is critical. In addition, the same mechanism that modulates delay also impacts SRAM operating margins. Both the average value of the history and its variation from one gate to the next are very important, as well as knowledge of the independent behavior of NFET (pulldown) and PFET (pullup) devices. While a number of techniques have been introduced to measure various aspects of history effect, at present there are no test structures for effective acquisition of data on the statistical variation of 1SW/2SW history within a large set of nominally identical circuits.

Experimental evaluation of history effects has typically involved high speed bench tests in an off-line setting. In one approach, the delays of a long chain of inverting devices in response to different input waveforms are analyzed. In this approach, the delays are determined and history components averaged over pullup and pulldown over a large number (e.g., 100 to 1000) gates. Recently, structures have been demonstrated for measuring some components of switching delay history using only low-speed inputs and outputs (I/O's). Such structures include long delay chain configurations that can be readily measured inline and provide history values to 2-3% precision, again averaged over pullup and pulldown and over a large number of gates. The simplified I/O requirements allow for the structures to be measured fairly rapidly in the manufacturing line.

In another approach, the difference in the delay of a (capacitively) loaded versus unloaded circuit is measured with sub-picosecond (ps) precision under different input conditions. The changes in this delay difference in response to changes in the input pulses can be used to deduce the various history components. This approach yields values for the pullup and pulldown components of history separately and for single devices, but under the assumption that the loaded and unloaded gates are identical. In this case, high-speed inputs and outputs are required. The necessary time resolved sampling measurements are relatively slow and cumbersome and not well suited for gathering statistics.

SUMMARY

In an exemplary embodiment, a test structure for gathering switching history effect statistics for semiconductor devices includes a waveform generator circuit configured to selectively generate a first test waveform representative of a first type (1SW) transistor switching event, and a second test waveform representative of a second type (2SW) transistor switching event; and a history element circuit coupled to the waveform generator circuit, the history element circuit including a device under test (DUT) therein, and a variable delay chain therein, wherein a selected one of the first and second test waveforms are input to both the DUT and the variable delay chain; wherein the history element circuit is configured to determine a fractional change in signal propagation delay through the DUT between the 1SW and 2SW transistor switching events, with the fractional change in signal propagation delay calibrated with timing measurements of a variable frequency ring oscillator included within a delay calibration unit; and wherein the test structure utilizes only external low-speed input and output signals with respect to a chip on which the waveform generator circuit, the history element circuit and the delay calibration unit are formed.

In another embodiment, an integrated test structure for gathering switching history effect statistics for semiconductor devices includes a waveform generator circuit configured to selectively generate a first test waveform representative of a first type (1SW) transistor switching event, and a second test waveform representative of a second type (2SW) transistor switching event; and a plurality of history element circuits coupled to the waveform generator circuit, each history element circuit including a device under test (DUT) therein, and a variable delay chain therein, wherein a selected one of the first and second test waveforms are input to both the DUT and the variable delay chain; wherein each history element circuit is configured to determine a fractional change in signal propagation delay through the DUT between the 1SW and 2SW transistor switching events, with the fractional change in signal propagation delay calibrated with timing measurements of a variable frequency ring oscillator included within a delay calibration unit; and wherein the test structure utilizes only external low-speed input and output signals with respect to a chip on which the waveform generator circuit, the history element circuits and the delay calibration unit are formed.

In still another embodiment, a method for gathering switching history effect statistics for semiconductor devices includes generating a first test waveform representative of a first type (1SW) transistor switching event; coupling the generated first type test waveform to both a device under test (DUT) and a variable delay chain included within history element circuit; generating a second test waveform representative of a second type (2SW) transistor switching event; coupling the generated second type test waveform to both the DUT and the variable delay chain; and determining a fractional change in signal propagation delay through the DUT between the 1SW and 2SW transistor switching events.

BRIEF DESCRIPTION OF THE SEVERAL VIEWS OF THE DRAWINGS

Referring to the exemplary drawings wherein like elements are numbered alike in the several Figures.

DETAILED DESCRIPTION

Measurements using the loaded versus unloaded delay approach on a small sample of SRAM inverters have shown device-to-device 1SW/2SW history variations in excess of 15%, implying a serious impact on SRAM margins. It is thus important to devise an efficient technique for gathering statistics on history effect for statistically significant groups of devices, preferably a technique that can be implemented as a routine inline test, requiring only low-speed input/output (I/O).

Accordingly, disclosed herein is a test structure for gathering statistics on history effect for statistically significant groups of devices, wherein the test structure may be implemented as a routine inline test requiring only low-speed I/O's. This structure makes use of recently demonstrated sub-picosecond (ps) clock-to-data input discrimination of a level sensitive latch, along with a calibrated electrically adjustable delay chain and self-timed pulse generation and detection circuitry to make 1SW/2SW history measurements on individual devices. A number of such history measurement circuits are then multiplexed together to enable efficient inline acquisition of statistical history data, which can be further accelerated by parallelism.

As used herein, the term "high-speed" with respect to a signal generally refers to a signal having rise and fall times on the order of about 150 picoseconds or less, and more specifically on the order of about 10 s of picoseconds to less than 10 picoseconds for signals internal to an integrated circuit. In contrast, the term "low-speed" with respect to a signal generally refers to a signal having rise and fall times on the order of about 100 nanoseconds or more.

Figure 1:
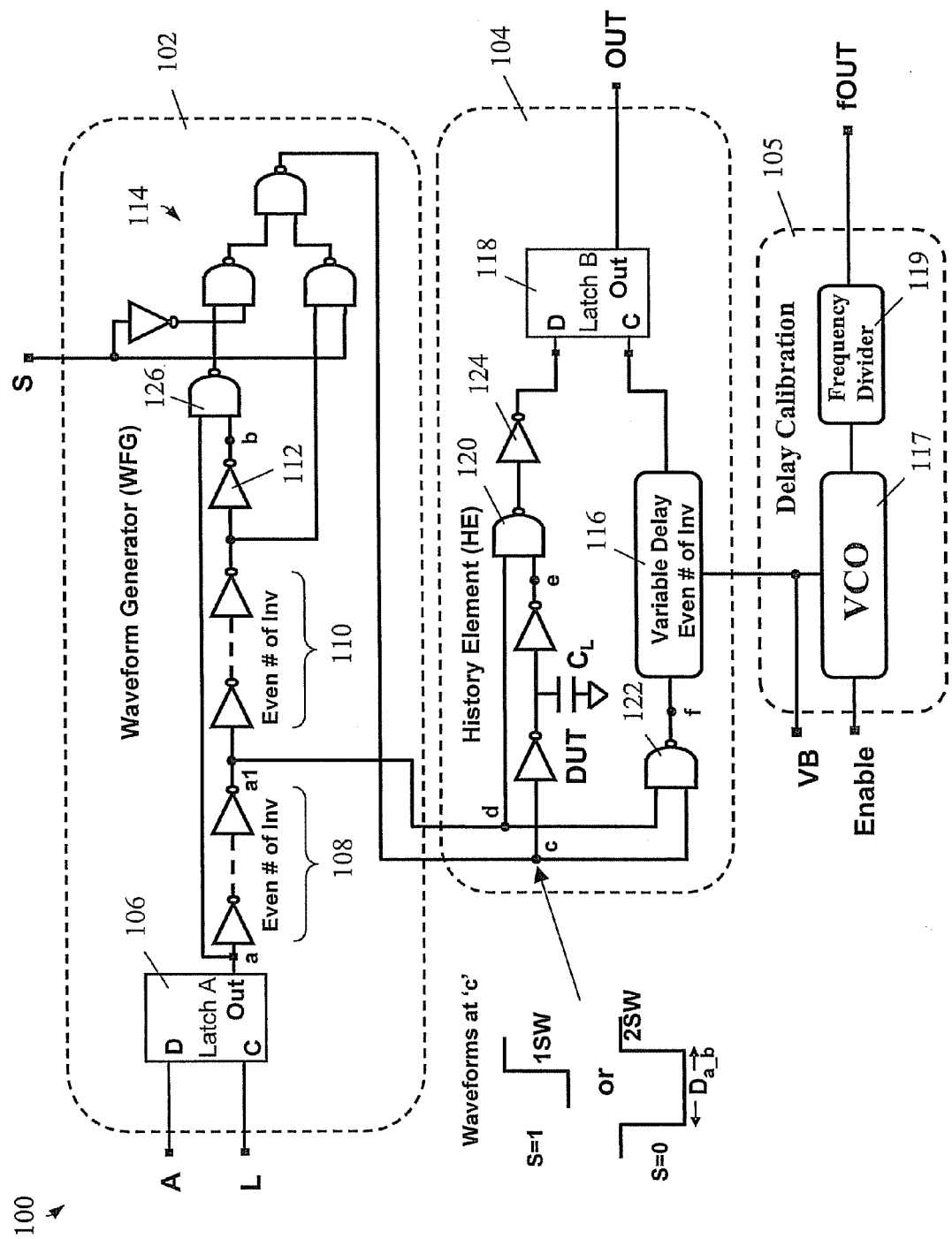
FIG. 1 is a schematic diagram of a self-timed test circuit 100 that is configured to measure the 1SW/2SW pulldown history of an individual MOSFET using only low-speed I/O's, in accordance with an embodiment of the invention.

Referring initially to FIG. 1, there is shown a schematic diagram of a self-timed test circuit 100 that is configured to measure the 1SW/2SW pulldown history of an individual MOSFET using only low-speed I/O's, in accordance with an embodiment of the invention. As is shown, the test circuit 100 includes three main sub circuits, a waveform generator (WFG) 102, a history element (HE) 104, and a delay calibration unit 105. As explained in further detail below, the WFG 102 includes a level sensitive latch 106 (Latch A) receiving low-speed input signals arm (A) and launch (L) as data and clock inputs, respectively, thereto. An inverter chain coupled to the output of Latch A has at least a first group 108 of an even number of inverters, a second group 110 of an even number of inverters, and a single inverter 112 at the end of the chain. Single inverter 112 can also be represented by an odd number of inverters, so long as the steady state logical value of node "b" in the inverter chain is the complement of the steady state logical value of node "a" (i.e., the output "Out" of Latch A) at the beginning of the inverter chain.

As further illustrated in FIG. 1, the WFG 102 also receives a third external input, S, which serves as a select signal for switching between a first type of waveform generated by WFG 102 and a second type of waveform generated by WFG 102. More specifically, the digital value of the select signal S determines whether the WFG 102 generates a 1SW type waveform (i.e., "0" to "1" transition after a "long" idle period, e.g., on the millisecond time scale) or a 2SW type waveform (i.e., "0" to "1" transition shortly after a "1" to "0" transition, e.g., on the 100's of picoseconds time scale). To this end, selection logic 114 selects whether the 1SW waveform (S=1) or the 2SW waveform (S=0) is input to the HE circuit 104 at node "c" therein.

As also explained in further detail below, the HE circuit 104 includes a device under test (DUT) (e.g., an inverter) that is capacitively loaded (represented by CL), an electronically adjustable delay chain 116 having an even number of inverters therein, and another level sensitive latch 118 (Latch B). The data (D) input of Latch B is coupled to the path of the output of the DUT while the clock (C) input of Latch B is coupled to the path of the output of the adjustable delay chain 116. The HE circuit 104 uses the clock/data input timing characters of level sensitive Latch B to enable high precision timing measurements.

The delay calibration unit 105 includes an independent variable frequency ring oscillator (RO) circuit, such as voltage controlled oscillator (VCO) 117, for example, and a frequency divider 119 coupled to the output of the VCO 117 for converting the output of the VCO 117 into a slower speed signal for external monitoring. As described in further detail hereinafter, timing information is extracted from the delay calibration unit 105 in order to determine the 1SW/2SW history values.

The test circuit 100 operates by measuring the delay through the single heavily loaded DUT and to then observe the change in this delay between 1SW and 2SW transitions. The fractional change in this delay represents the 1SW/2SW history. Through repeated experiments, the delay of the variable delay chain 116 may be tuned or adjusted so that the clock-to-data arrival time of the latch is within its transition region (i.e., to a random occurrence of whether the data signal arrives before or after the time threshold for the arrival of the clock signal) to a precision of less than 1 ps. Combined with the known characteristics of the latch 118, the other discrete gates within the HE circuit 104, and the variable delay chain 116, the delay through the loaded DUT can then be estimated. The change in delay in going from the 1SW to the 2SW transition can, in turn, be measured as the change in delay of the variable delay chain 116, which can then be used to obtain the 1SW/2SW history. For the exemplary test circuit 100 shown in FIG. 1, the pulldown delay (NFET dominated) of the DUT (inverter) is measured. It should be appreciated, however, that with minor modifications a similar circuit may be configured to analyze pullup delay (PFET dominated).

Figure 2:
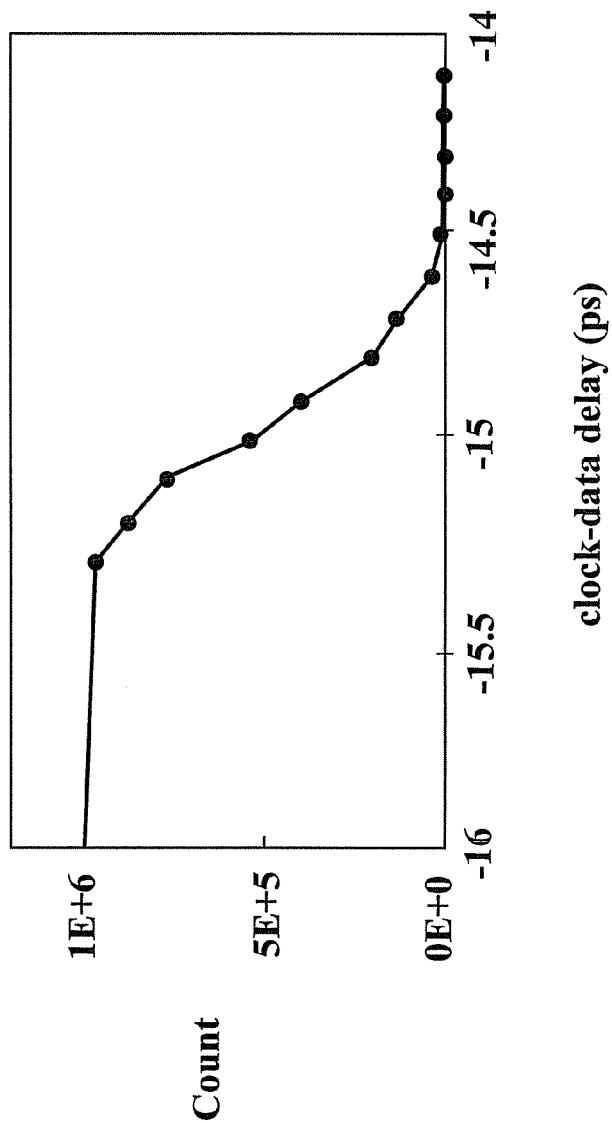
FIG. 2 is a graph illustrating representative timing characteristics measured for a 65-nm technology PD-SOI level sensitive latch.

With respect to the mechanics of measuring delay, FIG. 2 is a graph illustrating representative timing characteristics measured for a 65-nm technology PD-SOI level sensitive latch. More specifically, FIG. 2 illustrates count rate as a function of clock-to-data delay for a level sensitive latch. Measurements were made at a repetition rate of 1 MHz, with the latch reset between trials. As can be seen by the graph, the range in clock-to-data timing over which the latch transitions from always capturing the data to never capturing the data is less than 1 ps, with the clock signal arriving about 15 ps after the data.

Referring again to FIG. 1, by way of example it will be assumed that the delay through the loaded DUT is about 100 ps and dominates the delay from node "c" of the HE circuit to the Data input port D of Latch B. In contrast, the delay from node "c" to the Clock input port C of Latch B is dominated by the delay of the variable delay chain 116, which delay may be directly monitored by incorporating multiple copies of the delay chain circuitry into an independent ring oscillator (RO) circuit. As indicated above, such a circuit can be, for example, a voltage controlled ring oscillator (VCO) 117 where the controlling voltage is the power supply voltage of the ring oscillator. Alternatively, stages of the RO could comprise current starved inverters in which the stage delay depends on the value of an applied analog voltage.

In one implementation, the RO would comprise 10 segments, each segment having a NAND and variable delay chain such as those shown between point "c" and the clock input to Latch B, except that the NAND would be omitted from one segment to render the necessary odd number of inverting stages in the RO. The output of the RO (e.g., VCO 117) passes through the frequency divider 119 before reaching an independent output terminal (fOUT), thus lowering the frequency to about 1 MHz, consistent with low-speed I/O. The delay through the NAND and the variable delay, D(v), can then be determined as:

$$D(v)=0.1\times(1/2f) \quad [1]$$

where f is the oscillation frequency of the RO. The 1SW/2SW history of the DUT is defined as:

$$2[(D(1SW)-D(2SW)]/[D(1SW)+D(2SW)]. \quad [2]$$

For the 1SW transition of the DUT, $$D(\text{upper path})=D(1SW)+D(\text{other}) \text{ and } D(\text{lower path})=D(v1). \quad [3]$$

At the latch switching threshold, $$D(\text{upper path})=D(\text{lower path})+D(\text{data-clock offset}). \quad [4]$$

Similar equations hold for the 2SW transition of the DUT. The switching history of the DUT can thus be approximated as:

$$2[(D(v1)-D(v2)]/[D(v1)+D(v2)-\Delta]. \quad [5]$$

Δ, which will be on order of about 25 ps for a representative 65 nm PD-SOI technology, can be estimated via simulation.

Concern over contamination arising from history effects in the upper and lower path NANDs and the inverter directly following the DUT can be eliminated by making these body contacted devices. Such devices are somewhat slower but also have no history effect. It will be noted from the description below that all of the lower path devices and all of the upper path devices, except for the DUT and the following inverter, always experience only first switch transitions during timing measurements. The offset between the data and clock signal necessary to be at the latch transition region is about 15 ps. For a 1SW/2SW history of about 10%, D(v) will have to be adjusted by about 10 ps. Given various uncertainties (such as 1SW delays in the delay chain versus steady state delays from the ring oscillator) and approximations, the accuracy of the resultant history determined by this method will be within about 1-2%, which is sufficient for most applications.

In order to ensure that the 1SW/2SW history of the DUT dominates the necessary adjustment of the variable delay chain 116, the WFG circuit 102 (in addition to generating the 1SW and 2SW waveforms at node "c" of the HE circuit 102) also generates control waveforms at node "d" of the HE circuit 102. As can be seen from FIG. 1, the control waveform originates from the output of the first group 108 of an even number of inverters in the WFG circuit 102. Accordingly, the delay $D_{a\_c}$ for a signal from node "a" in the WFG circuit 102 to node "c" in the HE circuit 104 must be longer than the delay $D_{a\_d}$ from node "a" to "d". Hence, for 1SW(S=1), $$D_{a\_c}>D_{a\_d}(S=1) \quad [6]$$

For the 2SW case (S=0), the time interval between 1SW and 2SW is equal to the delay $D_{a\_b}$ from node "a" to node "b" within the WFG circuit 102. This represents the delay of an odd number of inverter stages in this path and is typically on the order of 100 to a few 100 picoseconds. In addition, for the first ("1" to "0") transition in the 2SW waveform, the delay from node "a" to node "c" via the upper path in the WFG circuit must also be smaller than $D_{a\_d}$.

$$D_{a\_c}<D_{a\_d}(S=0) \quad [7]$$

Figure 3:
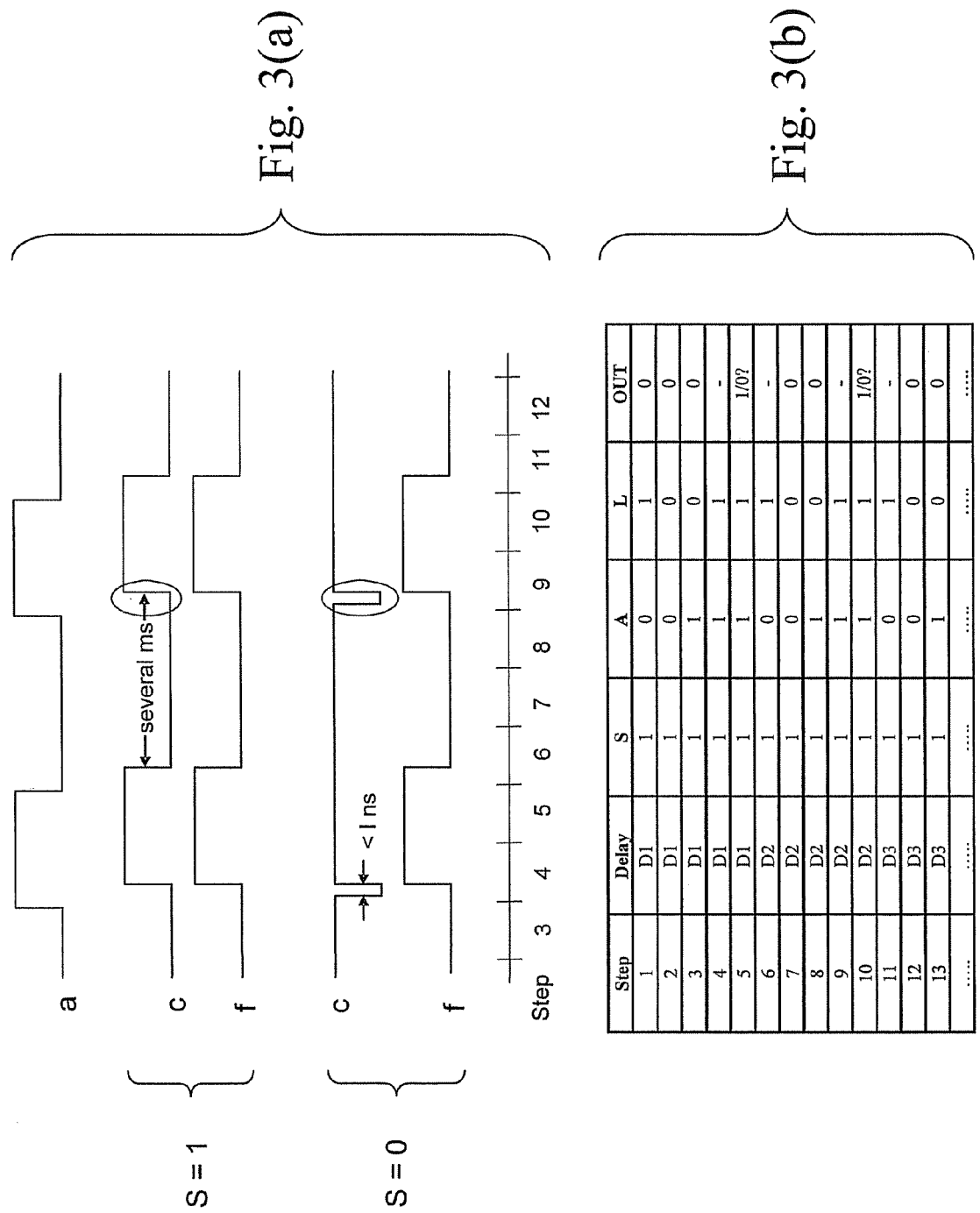
FIG. 3(a) is a waveform timing diagram illustrating an input waveform at node "a" of the WFG circuit, and the corresponding waveforms at nodes "c" and "f" in the HE circuit shown in FIG. 1, for both S=1 (1SW) and S=0 (2SW)
FIG. 3(b) is a table that describes the steps used to obtain a single 1SW/2SW history measurement.

FIG. 3(a) is a waveform timing diagram illustrating an input waveform at node "a" of the WFG circuit 102, and the corresponding waveforms at nodes "c" and "f" in the HE circuit 104 shown in FIG. 1 for both S=1 (1SW) and S=0 (2SW). The circled regions in the node "c" waveforms correspond to the 1SW and 2SW transitions shown in FIG. 1. An initial value of "0" at node "a" (i.e., the output of Latch A) resets Latch B by loading a "0" therein. Latch A is used to produce a sharp rising signal at node "a".

The table shown in FIG. 3(b) describes the steps used to obtain a single 1SW/2SW history measurement. Step 1 loads a "0" in both Latch A and Latch B by clocking a logic "0" on external data input A into Latch A with external clock signal L. L is toggled low in step 2, and in step 3 a logic "1" is now present on the external data input A. Then, in step 4, the logic "1" value is captured in Latch A by toggling external clock signal input L to "1", thus causing node "a" of the WFG circuit to transition to "1". In step 5, the output of Latch B is read out, wherein the value of OUT is dependent upon the delay of the DUT and the delay of the variable delay chain 116. Steps 1 through 5 are then repeated for each new setting of the variable delay line.

A more detailed understanding of the above mentioned operating steps will be obtained with reference once again to FIG. 1. In the above example, S=1 to select 1SW waveforms. Again, in step 1, the Latch A data input (A) is set at "0" and Latch A input clock signal (L) is set at "1". Tracing these values through the logic of test circuit 100, it will be seen that this places a "1" on the clock input of Latch B and a "0" on the data port of Latch B, the resulting in an output of "0" from Latch B. When L is switched from "1" to "0" in step 2, nothing changes internally in the test circuit 100 in response thereto. In Step 3, when input A is switched from "0" to "1" nothing yet changes internally in the test circuit 100 in response thereto.

In Step 4, when the external clock input L is switched from "0" back to "1", the resulting single sharp edge at the output of Latch A (node "a") then drives a number of self-timed events. After a short time interval $D_{a\_d}$ (corresponding to the delay through the first group 108 of an even number of inverters) a rising edge appears at node "d" of the HE circuit 104, thus placing logical "1" values on first (upper) inputs of each of a pair of NAND gates 120, 122 coupled to node "d". At this moment in time, node "c" and therefore node "e" of the HE circuit 104 have not yet transitioned from "0" to "1" due to the longer delay path of node "c" with respect to node "d". This being the case, the second (lower) inputs of the pair of NAND gates 120, 122 respectively coupled to nodes "e" and "c" are still at logical "0" meaning that the outputs of the NAND gates are still at "1".

Then, at a later time corresponding to the delay $D_{a\_c}$, a rising edge eventually appears at node "c", passing through the pairs of even inverter stages 108, 110 and bypassing inverter 112 and NAND gate 126. Again, node "c" drives both the DUT and the variable delay chain 116. This results in the lower inputs of the NAND gates 120, 122 switching to "1", thereby switching NAND gate outputs to "0". This in turn leads to a rising Data input (due to inverter 124) and a falling clock input to Latch B. Whether or not the "1" applied to the Data port of Latch B is actually captured and transmitted to the output OUT of Latch B depends on the relative timing of the Clock and Data signals, with the discrimination made by the timing dependent transfer characteristic of the latch, as previously described.

In Step 5, the output of Latch B is observed to be either a "1" or a "0". In Step 6, the A input to Latch A is returned to "0" and the entire circuit resets to the condition it was in Step 1. This cycle is then repeated multiple times with different variable delay chain settings to determine the timing of the latch transition, and thus the delay of the DUT path. It may be convenient (although not necessary) to have all time steps of equal duration. However, in order to ensure that DUT body potentials are correctly initialized for each experiment for the 1SW event, the recurring time increment corresponding to that from Step 6 to Step 9 is on the order of several milliseconds.

Next, a similar set of experiments are conducted but now with S=0. The corresponding waveforms at nodes "c" and "f" of FIG. 1 are shown as the lower two waveforms labeled "c" and "f" in FIG. 3(a). In all steps where S is set to "0" for generating 2SW waveforms, the rising waveform to the DUT is preceded by a falling waveform within a relatively short time interval (e.g., <1 ns). Steps 1, 2, and 3 are repeated, and the test circuit 100 behaves the same as for a 1SW waveform to this point, except that the use of the selected circuit path involving inverter 112 and NAND gate 126 places node "c" at an initial logic "1" value when node "a" is at logic "0".

Then, at step 4, Latch A generates a single sharp edge at node "a". In this instance, the first signal to reach the HE circuit 104 is the falling edge at node "c" and then at node "e", because the rising edge at node "a" is directly coupled to the top input of NAND gate 126 prior to the falling edge reaching node "b" (coupled to the bottom input of NAND gate 126). As a result, the output of NAND gate 126 (and thus the value of node "c"_ briefly drops to "0" until such time as the node "a" signal propagates all the way through even inverter stages 108, 110 and inverter 112 so as to switch the bottom input of NAND gate 126 to "0" and change its output back to "1". However, in the interim, the falling edge of node "c" exercises the DUT through a 1SW pullup. The output values of both NAND gates 122, 124 in the HE circuit 104 paths remain at "1" given that node "d" still remains at "0". This is ensured by the design condition that $D_{a\_c}(S=0) < D_{a\_d}$.

The next signal to arrive at the HE circuit is the rising edge at node "d", having now passed through even inverter stage 108. This then places "1" values on top inputs of both NAND gates 122, 124. However, since the bottom inputs of NAND gates 122, 124 were just previously switched to "0" by the falling signal that arrived at node "c", the outputs of NAND gates 122, 124 remain at "1" at this point. Finally, another signal, this time a rising edge, arrives at node "c" once the inverted valued of the node "a" signal finally arrives at node "b", thus switching the output of NAND gate 126 back to "0". This rising edge signal on node "c" (occurring $D_{a\_b}$ after the falling edge signal) induces a 2SW pulldown transition in the DUT and is then transmitted as a "1" to the data port of Latch B. The node "c" rising edge signal also passes through the variable delay chain 116 and applies a "0" to the clock port of Latch B.

As before, whether or not the "1" applied to the data port is captured and transmitted to the output of latch B depends on the relative timing of the clock and data signals, with the discrimination made by the timing dependent transfer characteristics of the latch, as previously described. In Step 5, the output of Latch B is observed to be a "1" or a "0". In Step 6, the external data (A) input to Latch A is returned to "0" and the entire circuit resets to the condition it was in Step 1. This cycle is then repeated multiple times with different variable delay chain settings to determine the timing of the latch transition and thus the delay of the DUT path, this time under 2SW conditions.

It should be noted at this point that by changing the number of stages between nodes "a1" and "b" in the WFG circuit 102 of FIG. 1, it is also possible to obtain information on the time constant of the floating-body.

Figure 4:
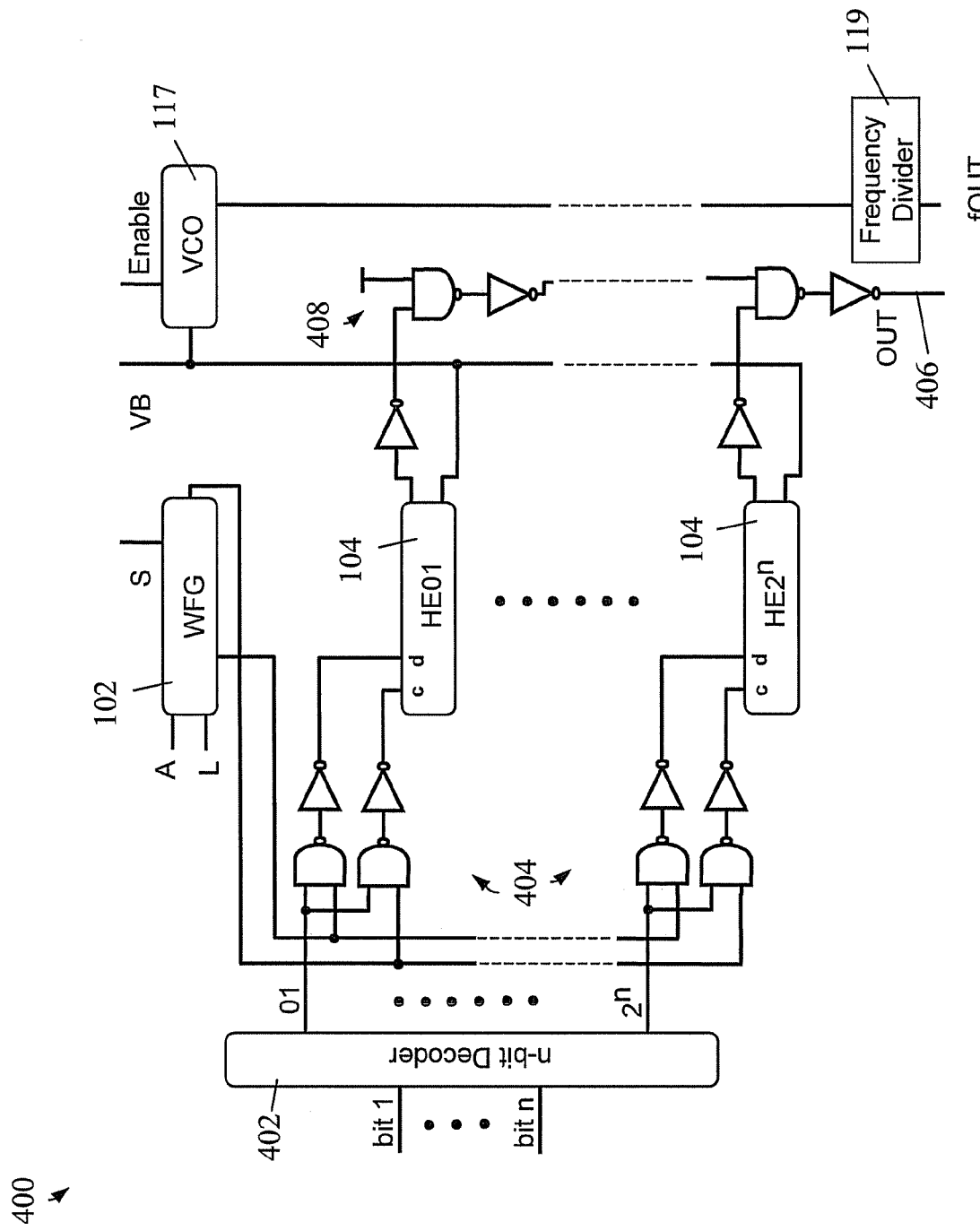
FIG. 4 is a schematic diagram of a history block test circuit, in accordance with a further embodiment of the invention.

Referring now to FIG. 4, there is shown a schematic diagram of a history block test circuit 400, in accordance with a further embodiment of the invention. The history block test circuit 400 demonstrates one example of how several HE circuits 104 may be combined with a single WFG circuit 102 to sequentially measure the 1SW/2SW pulldown history of $2^n$ (for example, 16) nominally identical inverters. To this end, a decoder 402 with supporting multiplexing logic 404 is used to select an active HE circuit 104, with each selected active HE circuit 104 being measured sequentially as described above by the table in FIG. 3(b).

The respective outputs of each of the HE circuits 104 are coupled to a common output bus 406, with supporting multiplexing logic 408 such that only the output of the selected HE circuit 104 actually appears on the output bus 406. As indicated above, a single VCO 117 provides a timing reference for the entire block test circuit 400, with the frequency thereof monitored at terminal fOUT through a frequency divider 117 to reduce the frequency to the MHz range.

Figure 5:
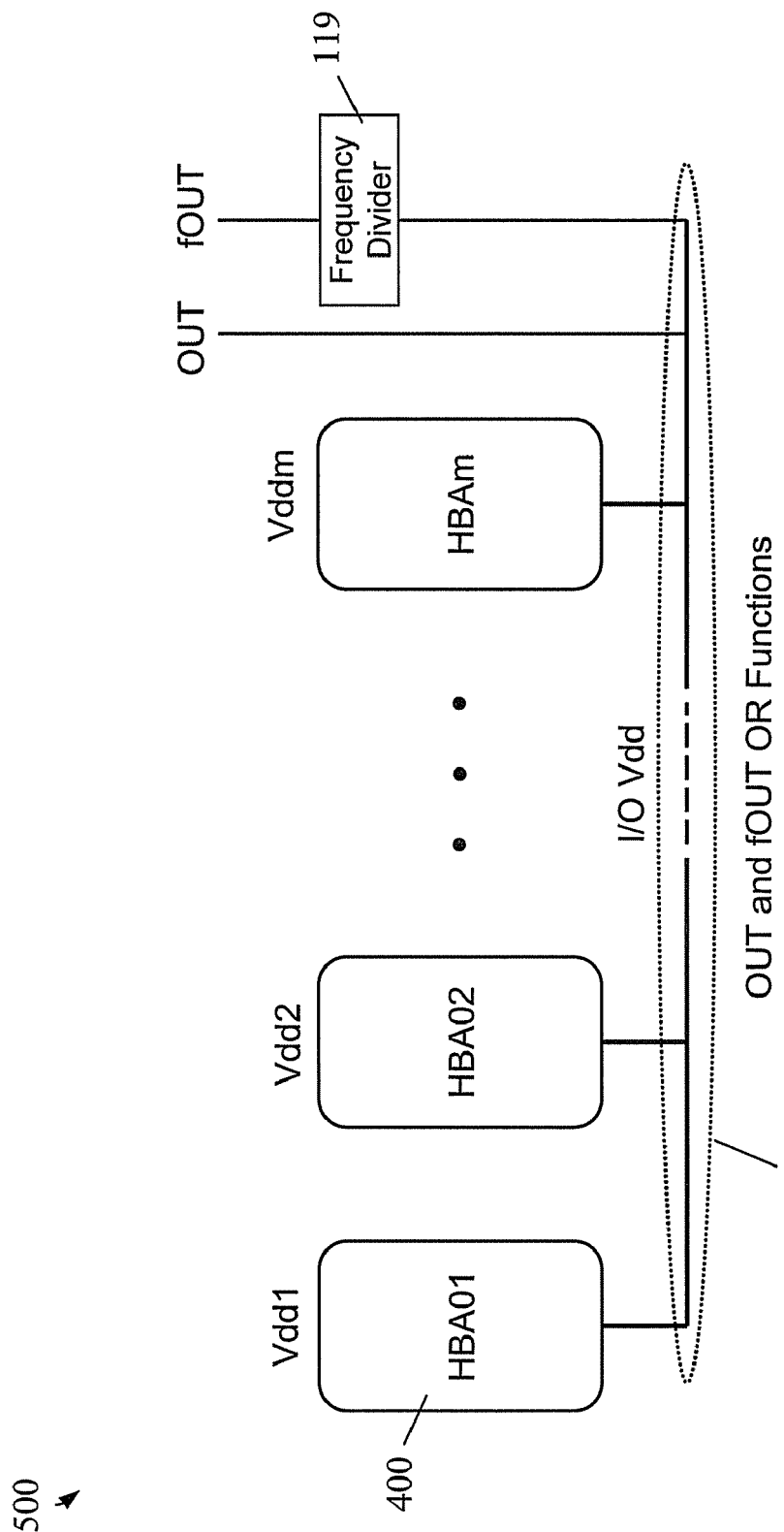
FIG. 5 is a schematic diagram of an integrated test structure that incorporates several history block test circuits of FIG. 4, in accordance with a further embodiment of the invention.

Referring now to FIG. 5, there is shown a schematic diagram of an integrated test structure 500 that incorporates several (e.g., 8) history block test circuits 400 for measuring the 1SW/2SW pulldown history distribution of a group of (e.g., 128) nominally identical inverters, in accordance with a further embodiment of the invention. Each of the history block test circuits 400 (also labeled HBA01, HBA02, ..., HBAm) in FIG. 5) is powered by an independent power supply (Vdd1, Vdd2, ..., Vddm) so that the ORing function circuitry 502 connects the single HE circuit under test output and its associated VCO output to the test structure outputs (OUT and fOUT respectively). The fOUT terminal can be directly preceded by an appropriate common frequency divider 119 with the individual frequency dividers being omitted from the corresponding history block circuits 400. By appropriate cycling of the decoder inputs (shared by all history block test circuits 400) and the independent history block test circuits power inputs, the 128 DUTs may be systematically measured in a sequential fashion and the results combined to render the statistical distribution of he pulldown 1SW/2SW history. The configuration of the embodiment of FIG. 5 is particularly well suited for a traditional parametric inline tester with a limited number of source/measure units and only low-speed I/O's.

Although the integrated test structure 500 depicted in FIG. 5 is well suited to provide history statistics, the actual test time may be relatively long due to the inherently sequential nature of the measurements. For a tester with a larger number of pins, and a source/measure unit (SMU) associated with each pin, designs configured for parallel testing can enable a significantly reduced test time. The simplest version of this principle is to have an arrangement such as shown in FIG. 5, but with each history block test circuit 400 having dedicated output lines. Some version of this could be implemented on a traditional inline parametric having a sufficient number of SMUs.

Figure 6:
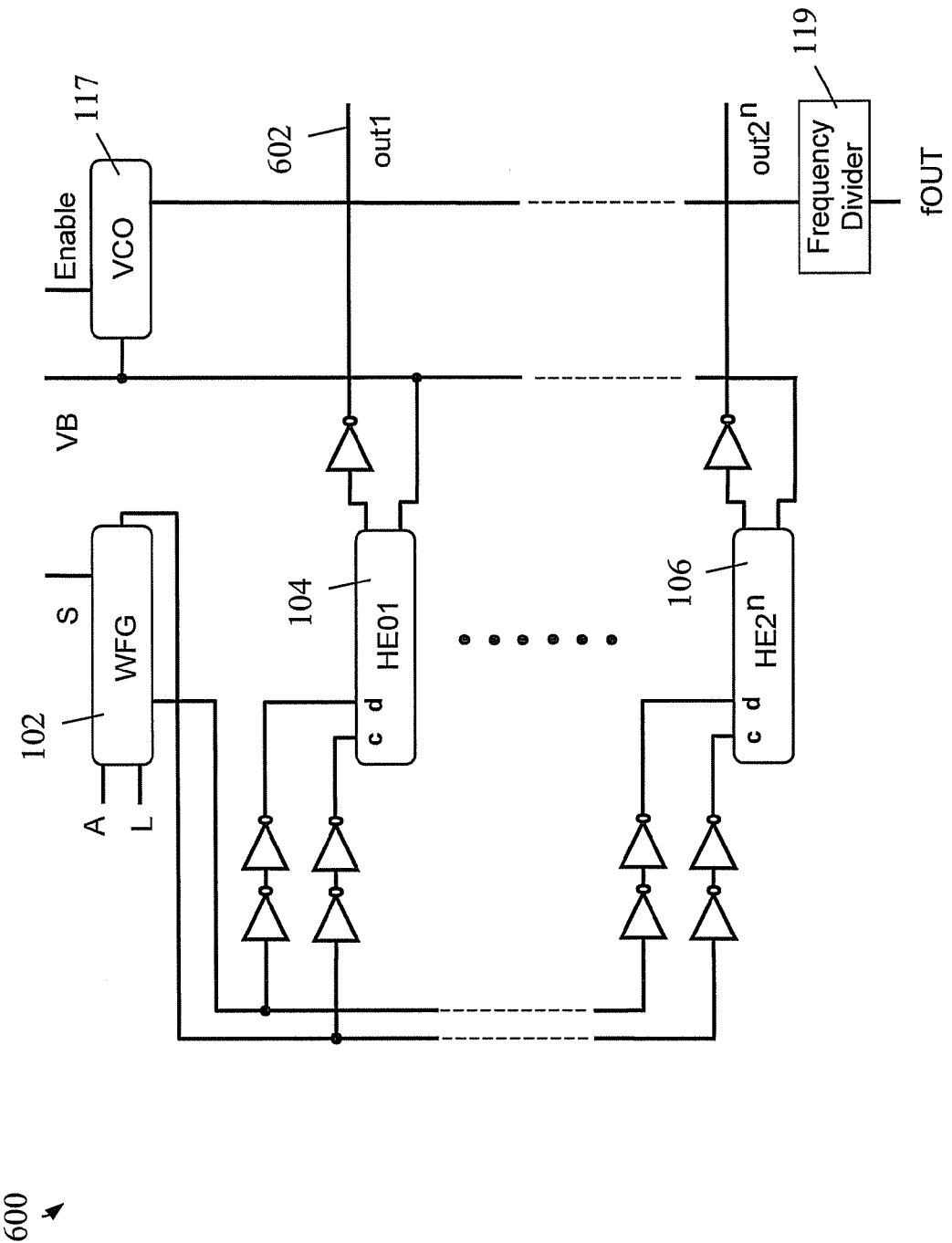
FIG. 6 is a schematic diagram of another history block test circuit, in accordance with a further embodiment of the invention.

Alternatively, with a tester having full digital and parametric capability associated with each pin, the test structure design can also be configured to leverage these characteristics. One example of how to implement this approach with the above described test structure is illustrated in FIG. 6. More specifically, FIG. 6 is a schematic diagram of another history block test circuit 600, in accordance with a further embodiment of the invention. The history block test circuit 600, in contrast to the history block test circuit 400 of FIG. 4, does not utilize a decoder or output bus multiplexing logic. Instead, all of the $2^n$ HE circuits 104 are addressed, with their respective outputs simultaneously delivered on output buses 602 (out1 . . . out$2^n$). The fOUT terminal can be directly preceded by an appropriate common frequency divider 119.

Figure 7:
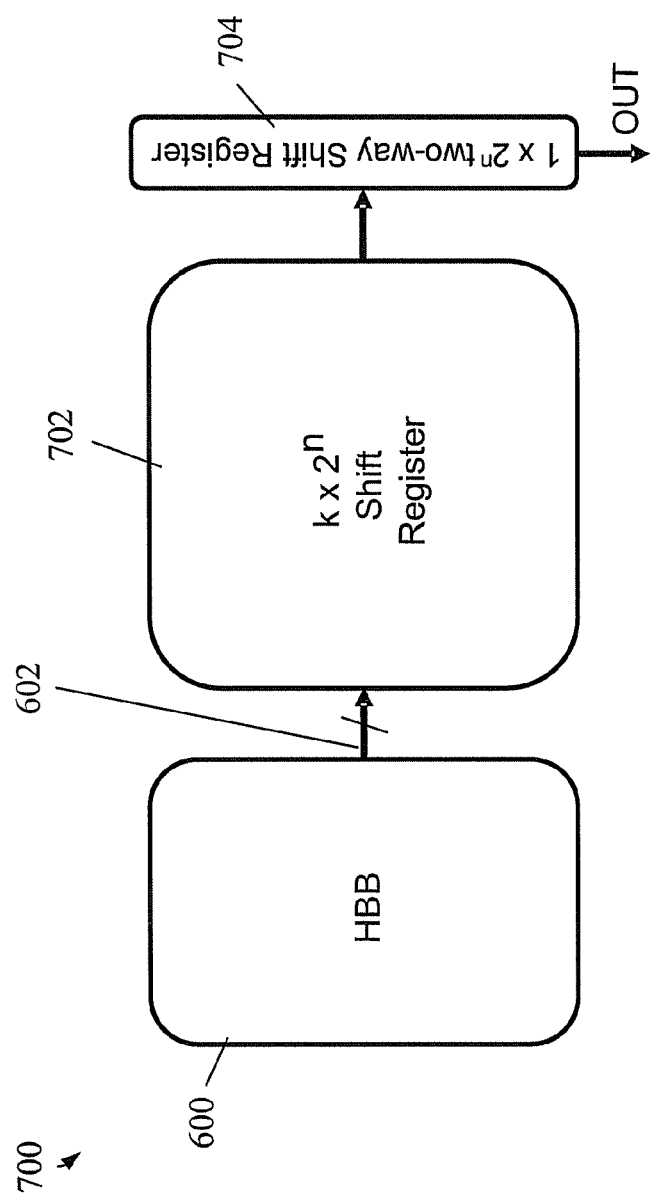
FIG. 7 is a schematic diagram of an integrated test structure that processes the multiple outputs of a history block test circuit of FIG. 6, in accordance with a further embodiment of the invention.

Finally, FIG. 7 is a schematic diagram of an integrated test structure 700 that processes the multiple outputs 602 of a history block test circuit 600 for measuring the 1SW/2SW pulldown history distribution of a group of nominally identical inverters, in accordance with a further embodiment of the invention. As shown, the outputs 602 are directed into a k×$2^n$ shift register bank 702 (where exemplary practical values for k and $2^n$ are 64 and 16, respectively). After proper initialization of the entire system and with S=1, all of the HE circuits are exercised in parallel through a set of k/2 1SW sequences, each with an incrementally different delay chain adjustment. The resultant "0" or "1" from each of these experiments is fed into the shift register bank 702, filling half of that bank after the first k/2 sequences. Input S is then switched from "1" to "0" and k/2 more sequences are run, rendering a full k×$2^n$ shift register bank containing an entire set of 1SW/2SW history data for the $2^n$ HE circuits.

The contents of the shift register bank 702 are then read out sequentially through a single output line via a two-way 1×$2^n$ shift register 704. First, a column of data is read from left to right, from the register bank 702 into the two-way register 704. Then, the $2^n$ bits are shifted vertically to the OUT port of the two-way shift register 704, one bit at a time. After $2^n$ such operations, another column is shifted in from the register bank 702. This process continues until the register bank 702 is emptied of data, and at the same time completely reset to zero values by the "0" outputs that that have been set up via the HE circuit prior to the readout of the data. These completely digital operations can be carried out at a clock rate one the order of several MHz so that the entire contents of the shift register bank (of order 2 kb) can be read out in less than a millisecond. Since each history sequence takes at least several ms to execute (FIG. 3(a)) the time to read out the data is negligible. The entire experiment is thus speeded up in direct proportion to the number of history sequences that can be run in parallel. This in turn will ultimately be limited by the integrity and stability of the power distribution system that can be implemented. By partitioning a system into several circuits as shown in FIG. 7, each with an independent power supply, overall speed increases over the sequential circuit shown in FIG. 5 by a factor of about 100 times or more should be possible.

As will thus be appreciated, a test circuit and methodology for gathering statistics on history effect for statistically significant groups of devices may be implemented as a routine inline test requiring only low-speed I/O's. This disclosed test circuit embodiments make use of the recently demonstrated sub-ps clock-to-data input discrimination of a level sensitive latch, along with a calibrated electrically adjustable delay chain and self-timed pulse generation and detection circuitry to make 1SW/2SW history measurements on individual devices. A number of such history measurement circuits are then multiplexed together to enable efficient inline acquisition of statistical history data, which can be further accelerated by parallelism. With straightforward modifications, the above described approach works for PFET as well as NFET DUTs.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. A test structure for gathering switching history effect statistics for semiconductor devices, the test structure comprising:
    a waveform generator circuit configured to selectively generate a first test waveform representative of a first type (1SW) transistor switching event, and a second test waveform representative of a second type (2SW) transistor switching event; and
    a history element circuit coupled to the waveform generator circuit, the history element circuit including a device under test (DUT) therein, and a variable delay chain therein, wherein a selected one of the first and second test waveforms are input to both the DUT and the variable delay chain;
    wherein the history element circuit is configured to determine a fractional change in signal propagation delay through the DUT between the 1SW and 2SW transistor switching events, with the fractional change in signal propagation delay calibrated with timing measurements of a variable frequency ring oscillator included within a delay calibration unit; and
    wherein the test structure utilizes only external low-speed input and output signals with respect to a chip on which the waveform generator circuit, the history element circuit and the delay calibration unit are formed.

2. The test structure of claim 1, wherein the 1SW transistor switching event comprises switching a state of the DUT after a rest state on the order of milliseconds or more, and the 2SW transistor switching event comprises switching the state of the DUT for a second time within a period on the order of about one or more nanoseconds after switching the state of the DUT for a first time.

3. The test structure of claim 1, wherein the waveform generator circuit further comprises:

a level sensitive input latch having external data and clock inputs;
an inverter chain coupled to an output of the input latch;
an inverter chain bypass path coupled to an output of the input latch; and
selection logic coupled to the inverter chain and inverter chain bypass path, the selection logic having an external switch input for selecting one of the first test waveform and the second test waveform as an output of the waveform generator circuit.

4. The test structure of claim 1, wherein the DUT is capacitively loaded.

5. The test structure of claim 1, wherein the history element circuit further comprises a level sensitive output latch having a data input thereto driven by an output of the DUT, and a clock input thereto driven by an output of the variable delay chain, wherein adjustments to the delay of the variable delay chain determine, with sub-picosecond precision against a timing threshold, whether or not the selected first or second test waveform fed to the DUT is captured by the output latch.

6. The test structure of claim 5, wherein the history element circuit is further coupled to a control waveform generated by the waveform generator circuit, the control waveform coupled to logic in a signal path of the variable delay chain and to logic within a signal path of the data input of the output latch, wherein the control waveform is operative to ensure that the fractional delay change of the DUT between 1SW and 2SW waveforms dominates the adjustment of the variable delay chain used to keep the output latch at the discriminating timing threshold.

7. The test structure of claim 1, wherein the variable frequency ring oscillator circuitry included within the delay calibration unit comprises copies of circuitry of the variable delay chain.

8. The test structure of claim 1, wherein the period of the variable frequency ring oscillator is directly proportional to the delay of the variable delay chain.

9. The test structure of claim 1, wherein a common control signal determines the frequency of the variable frequency ring oscillator and the delay of the variable delay chain.

10. The test structure of claim 9, wherein the variable frequency ring oscillator circuitry comprises a voltage controlled ring oscillator where the common control signal is a power supply voltage thereof.

11. The test structure of claim 7, wherein the ring oscillator circuitry and the variable delay chain comprise current starved inverters in which a stage delay thereof depends on the value of an applied analog voltage thereto.

12. An integrated test structure for gathering switching history effect statistics for semiconductor devices, the test structure comprising:
a waveform generator circuit configured to selectively generate a first test waveform representative of a first type (1SW) transistor switching event, and a second test waveform representative of a second type (2SW) transistor switching event; and
a plurality of history element circuits coupled to the waveform generator circuit, each history element circuit including a device under test (DUT) therein, and a variable delay chain therein, wherein a selected one of the first and second test waveforms are input to both the DUT and the variable delay chain;
wherein each history element circuit is configured to determine a fractional change in signal propagation delay through the DUT between the 1SW and 2SW transistor switching events, with the fractional change in signal propagation delay calibrated with timing measurements of a variable frequency ring oscillator included within a delay calibration unit; and
wherein the test structure utilizes only external low-speed input and output signals with respect to a chip on which the waveform generator circuit, the history element circuits and the delay calibration unit are formed.

13. The integrated test structure of claim 12, wherein the history element circuit further comprises a level sensitive output latch having a data input thereto driven by an output of the DUT, and a clock input thereto driven by an output of the variable delay chain, wherein adjustments to the delay of the variable delay chain determine, with sub-picosecond precision against a timing threshold, whether or not the selected first or second test waveform fed to the DUT is captured by the output latch.

14. The integrated test structure of claim 13, wherein the history element circuit is further coupled to a control waveform generated by the waveform generator circuit, the control waveform coupled to logic in a signal path of the variable delay chain and to logic within a signal path of the data input of the output latch, wherein the control waveform is operative to ensure that the fractional delay change of the DUT between 1SW and 2SW waveforms dominates the adjustment of the variable delay chain used to keep the output latch at the discriminating timing threshold.

15. The integrated test circuit structure of claim 12, further comprising a decoder and multiplexing logic such that only a selected one of the plurality of history element circuits receives one or more input signals from the waveform generator at a given time.

16. The integrated test circuit structure of claim 15, further comprising additional multiplexing logic coupled to an output bus common to the plurality of history element circuits, such that only an output of the selected one of the plurality of history element circuits appears on the output bus.

17. The integrated test circuit of claim 15, further comprising a plurality of additional output buses, each associated with additional pluralities of waveform generator circuits and history element circuits so as to facilitate parallel testing of multiple DUTs at a given time.

18. The integrated test circuit structure of claim 12, wherein each of the plurality of history element circuits is configured to be simultaneously addressed by one or more input signals from the waveform generator at a given time, and deliver outputs therefrom on respective output buses so as to facilitate parallel testing of multiple DUTs at a given time.

19. The integrated test circuit structure of claim 18, further comprising a first shift register coupled to the respective output buses of the plurality of history element circuits and a second shift register coupled to the first shift register, the second shift register configure to sequentially readout columns of data from the first shift register.

20. The integrated test circuit structure of claim 19, further comprising a plurality of additional first and second shift register circuits associated with additional pluralities of output buses of history element circuits.

* * * * *